(12) United States Patent
Shizuno

(10) Patent No.: US 8,101,435 B2
(45) Date of Patent: Jan. 24, 2012

(54) FABRICATION METHOD FOR SEMICONDUCTOR DEVICE

(75) Inventor: Yoshinori Shizuno, Kanagawa (JP)

(73) Assignee: Lapis Semiconductor Co., Ltd. (JP)

( * ) Notice: Subject to any disclaimer, the term of this patent is extended or adjusted under 35 U.S.C. 154(b) by 0 days.

(21) Appl. No.: 12/929,914

(22) Filed: Feb. 24, 2011

(65) Prior Publication Data

US 2011/0151595 A1 Jun. 23, 2011

Related U.S. Application Data

(62) Division of application No. 12/153,499, filed on May 20, 2008, now Pat. No. 7,919,336.

(30) Foreign Application Priority Data

Jun. 11, 2007 (JP) .................................. 2007-153945

(51) Int. Cl.
*H01L 31/26* (2006.01)
*H01L 21/66* (2006.01)

(52) U.S. Cl. .............................. 438/15; 438/17; 438/109
(58) Field of Classification Search .................... 438/15, 438/17, 109
See application file for complete search history.

(56) References Cited

U.S. PATENT DOCUMENTS

| | | | |
|---|---|---|---|
| 6,958,544 B2 | 10/2005 | Sunohara | |
| 6,972,200 B2 * | 12/2005 | Cobbley et al. | 438/14 |
| 7,053,475 B2 | 5/2006 | Akagawa | |
| 7,327,021 B2 * | 2/2008 | Satou et al. | 257/686 |
| 7,507,602 B2 * | 3/2009 | Sunohara | 438/108 |
| 7,586,183 B2 * | 9/2009 | Kawabata et al. | 257/686 |
| 7,727,803 B2 * | 6/2010 | Yamagata | 438/107 |
| 7,932,605 B2 * | 4/2011 | Imoto et al. | 257/774 |
| 7,947,529 B2 * | 5/2011 | Koon et al. | 438/106 |
| 2001/0008794 A1 | 7/2001 | Akagawa | |
| 2001/0054758 A1 * | 12/2001 | Isaak | 257/686 |
| 2002/0146859 A1 | 10/2002 | Akagawa | |
| 2003/0162326 A1 * | 8/2003 | Tsubosaki et al. | 438/109 |
| 2003/0199111 A1 * | 10/2003 | Hamamura et al. | 438/17 |
| 2005/0014311 A1 * | 1/2005 | Hayasaka et al. | 438/109 |
| 2005/0212126 A1 | 9/2005 | Sunohara | |
| 2007/0057358 A1 * | 3/2007 | Satou et al. | 257/686 |
| 2007/0105248 A1 * | 5/2007 | Katoh | 438/17 |
| 2007/0259461 A1 * | 11/2007 | Yuzawa et al. | 438/17 |
| 2009/0008765 A1 | 1/2009 | Yamano et al. | |
| 2010/0052187 A1 * | 3/2010 | Lee et al. | 257/777 |
| 2010/0285635 A1 * | 11/2010 | Jo et al. | 438/109 |

FOREIGN PATENT DOCUMENTS

| JP | 2001-135787 | 5/2001 |
|---|---|---|
| JP | 2001-196525 | 7/2001 |

* cited by examiner

*Primary Examiner* — N Drew Richards
*Assistant Examiner* — Grant Withers
(74) *Attorney, Agent, or Firm* — Rabin & Berdo, PC

(57) ABSTRACT

A semiconductor device fabrication method can improve yield of semiconductor devices and decrease (or prevent) waste of non-defective semiconductor chips. This fabrication method has a step of performing characteristic inspection after packaging a semiconductor chip every time a semiconductor chip layer is formed. The fabrication method makes another semiconductor chip layer on this semiconductor chip layer only when the inspection indicates that the semiconductor chip is a non-defective product.

15 Claims, 13 Drawing Sheets

FABRICATION METHOD FOR SEMICONDUCTOR DEVICE

This is a Divisional of U.S. application Ser. No. 12/153,499, filed May 20, 2008, now U.S. Pat. No. 7,919,336 and allowed on Nov. 26, 2010, the subject matter of which is incorporated herein by reference.

BACKGROUND OF THE INVENTION

1. Field of the Invention

The present invention relates to a fabrication method for a semiconductor-chip-layered-type semiconductor device.

2. Description of the Related Art

As portable equipment increases its functions and decreases its size, the demand for SiP (System in Packages), where a plurality of semiconductor chips and passive elements are packaged at high density, is increasing. One type of SiP package structure is an MCP (Multi Chip Package) type, where a plurality of semiconductor chips are vertically stacked or horizontally disposed in an ordinary package having a standard external shape. Another type of SiP package structure is a module type, where a plurality of semiconductor chips and passive elements are mounted on an interposer.

Still another type of SiP package structure is a wafer-level type, which is characterized by a small and slim SiP structure and by a fact that a semiconductor device is fabricated at the wafer level. A typical example of this type of semiconductor device has a plurality of semiconductor chips mounted on a support substrate, an organic insulation layer covering the semiconductor chips, and interconnections formed on the organic insulation layer. Vias for connecting the pads of semiconductor chips with the interconnections are repeatedly formed and layered. Further, another vias are provided for electrically connecting the semiconductor chips in upper and lower layers (that is, semiconductor chips in a certain layer are connected to another semiconductor chips in its upper or lower layer by these vias). In other words, the above-described semiconductor device has a multilayer structure, where semiconductor chips from higher layers (or a top layer) to lower layers (or a bottom layer) are electrically connected.

Japanese Patent Application Laid-Open (Kokai) No. 2001-196525 discloses interconnection patterns that are formed on a support substrate. The interconnection patterns are electrically connected to semiconductor chips via bumps (in other words, flip chip packaging), so that smaller and lighter devices than prior art can be implemented.

Japanese Patent Application Laid-Open (Kokai) No. 2001-135787 discloses a method for judging the quality of bump connection accurately and quickly when flip chip packaging is performed for semiconductor devices having a chip-on-chip structure.

However, all characteristics of semiconductor chips cannot be confirmed merely by probing before packaging. In some cases a defective semiconductor chip is discovered only after the packaging thereof on an interconnection pattern. Therefore it is inevitable for defective semiconductor chips to be mixed in a device. When a defective semiconductor chip is found after the packaging, that device should be discarded even though the device contains non-defective semiconductor chips. In such a case, non-defective semiconductor chips are wasted. If semiconductor chips are made by a process of which stability of the yield is insufficient, then yield at the SiP level drops, and non-defective semiconductor chips are wasted.

SUMMARY OF THE INVENTION

It is an object of the present invention to provide a fabrication method for a semiconductor device, which can improve yield of a semiconductor device, and decrease the loss of non-defective semiconductor chips, by inspecting characteristics of a semiconductor chip each time a semiconductor chip layer is created.

According to a first aspect of the present invention, there is provided a fabrication method for a semiconductor device. The fabrication method includes a step of preparing a support substrate, and a step of forming a basic interconnection pattern on the support substrate. The fabrication method also includes a step of packaging one or more semiconductor chips on the basic interconnection pattern, and a step of inspecting the characteristics of the semiconductor chip(s), after the packaging, via at least a part of the basic interconnection pattern. The fabrication method also includes a step of forming an insulation layer on the support substrate only when the inspection step indicates that the semiconductor chip(s) is (are) non-defective. The insulation layer covers the basic interconnection pattern and the semiconductor chip on the support substrate. The fabrication method also includes a step of forming a conductive element which penetrates through the insulation layer and reaches the basic interconnection pattern. The fabrication method also includes a step of forming an additional interconnection pattern on the insulation layer. The additional interconnection pattern is connected with the basic interconnection pattern via the conductive element. The fabrication method also includes a repeat step of repeating the packaging step to the additional pattern formation step after the additional pattern formation step as long as the inspection step indicates that the semiconductor chip(s) is (are) non-defective.

The fabrication method may further include a step of reworking a defective semiconductor chip if the inspection step determines that the semiconductor chip is defective. The fabrication method may further include a step of grinding a surface of the semiconductor chip and a surface of the insulation layer after the insulation layer formation step. The fabrication method may further include a step of cutting the semiconductor device along a line, which is in parallel with a side face of the semiconductor chip and which does not separate the semiconductor chip from the conductive element, after the repeat step.

When a plurality of semiconductor chips are packaged on the basic interconnection pattern, a next packaging step during the repeat step may be performed only on those semiconductor chips which are determined to be non-defective in the preceding inspection step.

In the semiconductor device fabrication method of the present invention, the characteristic of each semiconductor chip is inspected each time a semiconductor chip layer is made. Therefore the yield of the semiconductor device can be improved, and loss (waste) of non-defective semiconductor chips can be decreased or prevented.

According to a second aspect of the present invention, there is provided another fabrication method for a semiconductor device. This fabrication method includes a step of preparing a support substrate, and a step of mounting one or more semiconductor chips on the support substrate. The fabrication method also includes a step of forming a lower insulation layer, which covers the semiconductor chip(s), on the support substrate. The fabrication method also includes a step of forming a basic conductive element which penetrates through the lower insulation layer and reaches a connection pad (pads) of the semiconductor chip(s). The fabrication method also includes a step of forming a basic interconnection pattern which is connected with the semiconductor chip(s) via the basic conductive element(s). The fabrication method also includes a basic inspection step of inspecting the characteristics of the semiconductor chip(s) via at least a part of the basic interconnection pattern. The fabrication method also includes a step of forming an upper insulation layer having the same thickness as the basic interconnection pattern on the lower insulation layer when the inspection step indicates that the semiconductor chip(s) possess(es) a predetermined characteristic. The fabrication method also includes an additional mounting step of mounting a second semiconductor chip (or second semiconductor chips) on the upper insulation layer and the basic interconnection pattern. The fabrication method also includes a step of forming an additional lower insulation layer which covers the second semiconductor chip(s) on the basic interconnection pattern and the upper insulation layer. The fabrication method also includes a step of forming an additional conductive element which penetrates through the additional lower insulation layer and reaches a connection pad(s) of the second semiconductor chip(s). The fabrication method also includes a step of forming a connection conductive element which reaches the basic interconnection pattern. The fabrication method also includes a step of forming an additional interconnection pattern which is connected to the second semiconductor chip(s) via the additional conductive element(s) and connected to the basic interconnection pattern via the connection conductive element(s). The fabrication method also includes an additional inspection step of inspecting the characteristics of the second semiconductor chip(s) via at least a part of the additional interconnection pattern. The fabrication method also includes an additional upper insulation layer formation step of forming an additional upper insulation layer having the same thickness as the additional interconnection pattern on the additional lower insulation layer when the additional inspection step indicates that the second semiconductor chip(s) possess(es) a predetermined characteristic.

The fabrication method may further include a repeat step of repeating the additional mounting step to the additional upper insulation layer formation step after the additional upper insulation layer formation step as long as the additional inspection step indicates that the semiconductor chip(s) is (are) non-defective. The fabrication method may further include a step of cutting the semiconductor device along a line, which is in parallel with a side face of the semiconductor chip(s) and which does not separate the semiconductor chip(s) from the connection conductive element(s), after the repeat step.

When a plurality of semiconductor chips are mounted on the basic interconnection pattern, the additional mounting step may be performed only on those semiconductor chips which are determined to be non-defective in the basic inspection step. The additional mounting step may be performed only on those semiconductor chips which are determined to be non-defective in the additional inspection step.

In the semiconductor device fabrication method of the present invention, the characteristic of each semiconductor chip is inspected each time a semiconductor chip layer is made. Therefore the yield of the semiconductor device can be improved, and loss of non-defective semiconductor chips can be decreased or prevented.

These and other objects, aspects and advantages of the present invention will become apparent to those skilled in the art from the following detailed description and appended claims when read and understood in conjunction with the accompanying drawings.

DETAILED DESCRIPTION OF THE INVENTION

Embodiments of the present invention will now be described with reference to the accompanying drawings.

Embodiment 1

Figure 1:
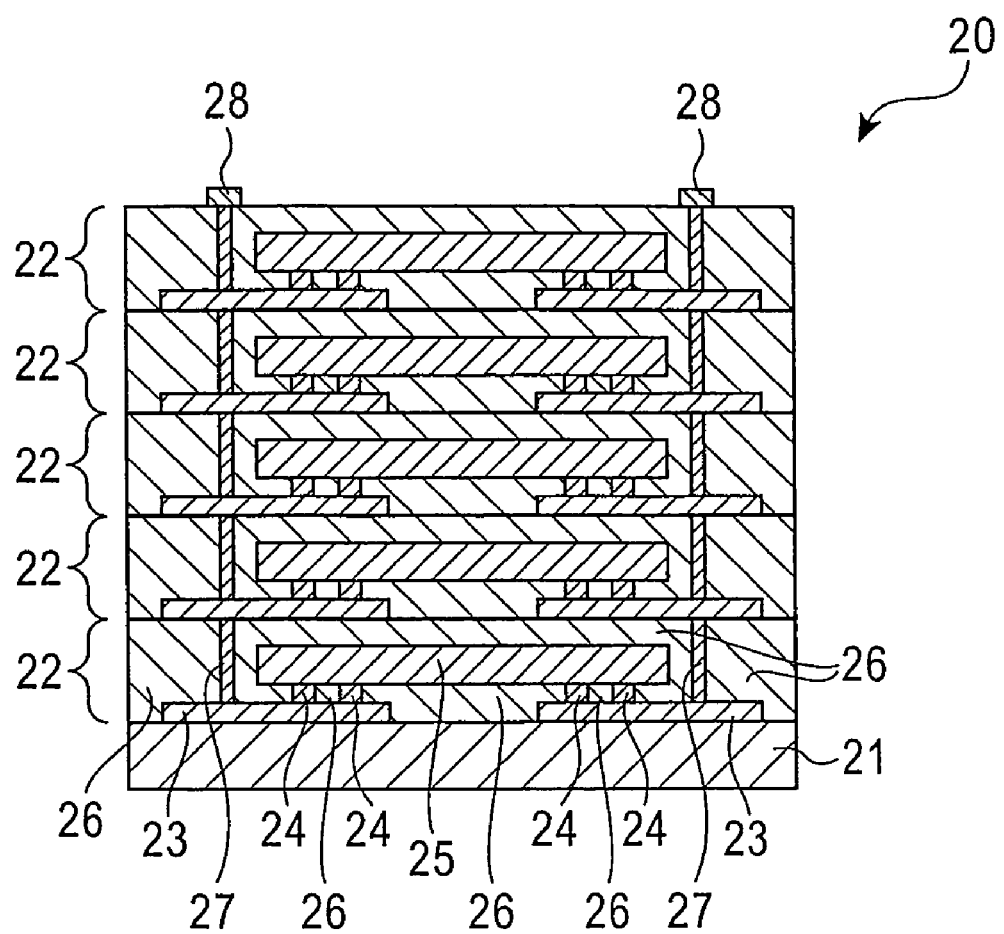
FIG. 1 is a cross-sectional view of a semiconductor device fabricated according to Embodiment 1 of the present invention.
Figure 2:
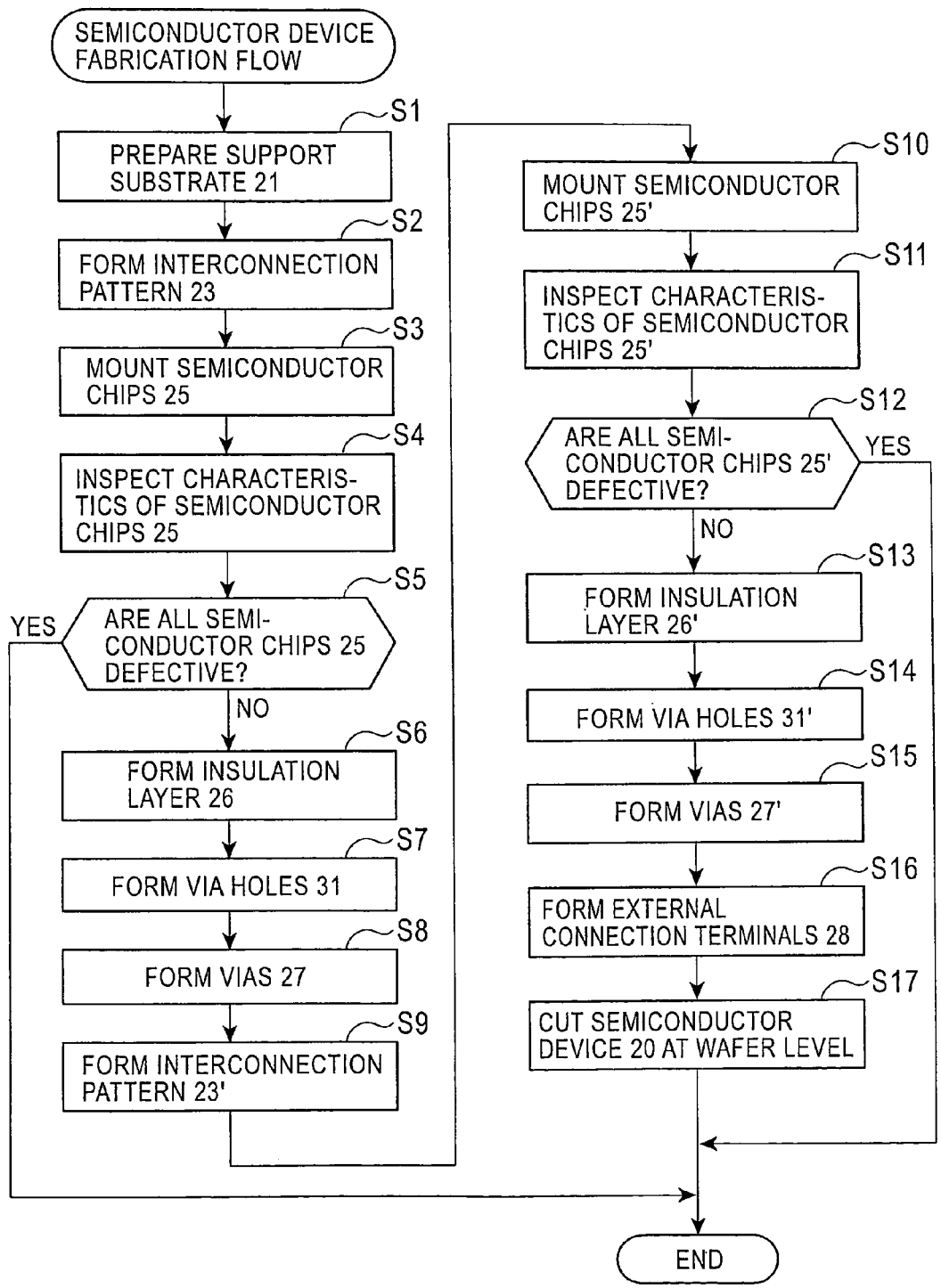
FIG. 2 is a flow chart depicting a semiconductor device fabrication method according to Embodiment 1 of the present invention.

Referring to FIG. 1, a structure of a semiconductor device 20 fabricated according to the present embodiment will be described.

The semiconductor device 20 has a plurality of chip interconnection layers 22 stacked on a support substrate 21. The support substrate 21 may be a silicon substrate, an organic substrate or a ceramic substrate. The number of layers of the chip interconnection layers 22 is not limited to the number shown in FIG. 1, but can be changed according to the characteristics of the semiconductor device 20.

Each chip interconnection layer 22 has interconnection patterns 23 constituting a predetermined circuit, a semiconductor chip 25 which is electrically connected on the interconnection patterns 23 via bumps 24, an insulation layer 26 which is formed on the support substrate 21 so as to cover the interconnection pattern 23 and the semiconductor chip 25, and vias 27 for electrically and vertically connecting the interconnection patterns 23 with each other in the stacked chip interconnection layers 22. An example of a material of the interconnection patterns 23 and the vias 27 is copper.

On the top chip interconnection layer 22 of the semiconductor device 20, external connection pads 28 are formed for external connection. Alternatively, an additional interconnection pattern 23 may be formed on the top layer 22 and one edge of this interconnection pattern 23 may be processed and used as the external connection pads 28.

Having this configuration, the semiconductor device 20 can allow the semiconductor chips 25 in the chip interconnection layers 22 to be electrically connected to each other through the vias 27, and acquire the desired electric signals from the external connection pads 28 positioned on the top layer.

An example of the fabrication method for the above-described semiconductor device 20 will now be described with reference to FIG. 2, FIG. 3A to 3F and FIGS. 4A to 4F. The number of semiconductor chips and the number of layers are not limited to the values shown in FIG. 3A to FIG. 4F, but may be changed according to the producing quantity and structure of the semiconductor devices to be fabricated. In the following description, a plurality of semiconductor devices are manufactured on a single substrate in the form of wafer, and will be cut to individual devices at the last manufacturing step.

Figure 3A:
FIG. 3A to FIG. 3F and FIG. 4A to FIG. 4F are a series of cross-sectional views of the semiconductor device depicting the fabrication steps according to Embodiment 1 of the present invention.

First, the support substrate 21 having a predetermined size is prepared (step S1). The cross-sectional view of the support substrate 21 is shown in FIG. 3A.

Figure 3B:
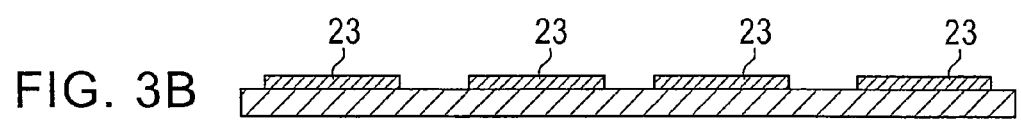

On the upper face of the support substrate 21, a copper metal film is deposited by a sputtering method, for example, and the interconnection patterns 23 are formed by performing predetermined patterning on the metal film using a photolithography technology (step S2). The cross-sectional view after forming the interconnection patterns 23 is shown in FIG. 3B. An example of concrete shapes of the interconnection patterns 23 will be described later. It should be noted that the two inner (or center) interconnection patterns 23 in FIG. 3B may be connected to each other so that the semiconductor chips 25 (FIG. 3C) will be electrically connected to each other.

Figure 3C:
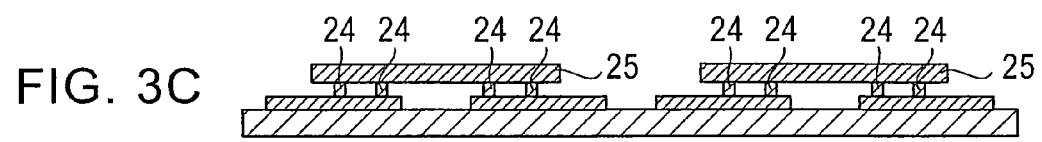

The semiconductor chips 25 are mounted on the interconnection patterns 23 formed on the support substrate 21 by a flip chip connection (step S3). This mounting by the flip chip connection is a method for mounting the semiconductor chips by thermally pressing the bumps 24 bonded to the pads (not illustrated) of the semiconductor chips 25 to the corresponding portions of the interconnection patterns 23. It should be noted that the bumps 24 may not always be bonded to the pads of the semiconductor chips 25, but may be bonded to the interconnection patterns 23 in advance. The cross-sectional view after the mounting of the semiconductor chips 25 is depicted in FIG. 3C.

Characteristics of each semiconductor chip 25 mounted via the interconnection patterns 23 are measured (step S4). For example, the measurement in step S4 is performed by contacting a probe (not illustrated) to a predetermined pad (a part of the interconnection pattern 23) according to the characteristics of the semiconductor chip 25 to be measured. It should be noted that depending on the measurement item, a probe may be contacted to one of the measurement pads which are electrically connected with the semiconductor chip 25, or a probe may be contacted to each one of a plurality of measurement pads to measure desired characteristics.

The result measured in step S4 is analyzed and evaluated (step S5), and processing advances to step S6 if the inspection step (step S5) determines that non-defective semiconductor chips 25 are mounted. If the inspection step determines that all semiconductor chips 25 are defective, the fabrication of the semiconductor device 20 ends. For example, the measurement result may be evaluated under prescribed conditions by a control device (not illustrated) which has received the measurement signals from the probe. These judgment conditions may be altered according to the type of the semiconductor chip 25.

Figure 3D:
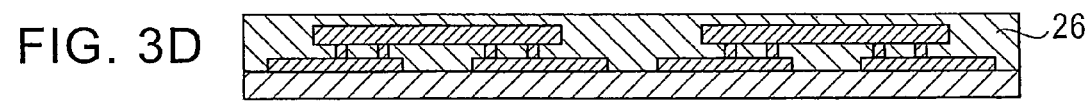

The insulation layer 26 is formed on the support substrate 21 so as to cover the semiconductor chips 25 and the interconnection patterns 23 (step S6). For example, the insulation layer 26 is formed of such a thermosetting resin as epoxy resin, phenol resin or polyimide resin, or such a photosensitive resin as photosensitive epoxy resin or photosensitive polyimide resin. The cross-sectional view after forming the insulation layer 26 is shown in FIG. 3D.

Figure 3E:
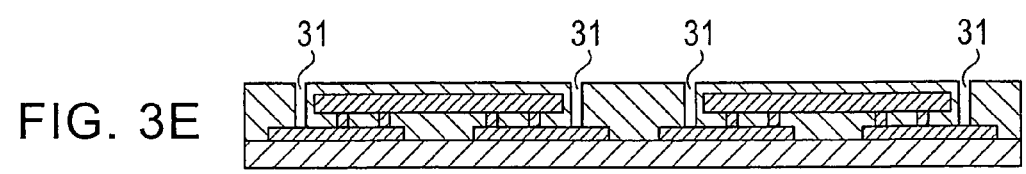

At predetermined positions of the insulation layer 26, the via holes 31 which reach the interconnection patterns 23 are formed using a laser processing technology (e.g., $CO_2$ laser or eximer laser), or photolithography technology (step S7). The cross-sectional view after forming the via holes 31 is shown in FIG. 3E.

Figure 3F:
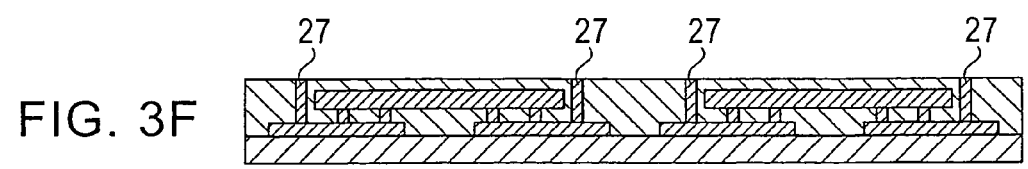

Copper, for example, is grown in the via holes 31, to form the vias 27 for electrically connecting to the interconnection patterns 23 (step S8). The cross-sectional view after forming the vias 27 is shown in FIG. 3F.

Figure 4A:
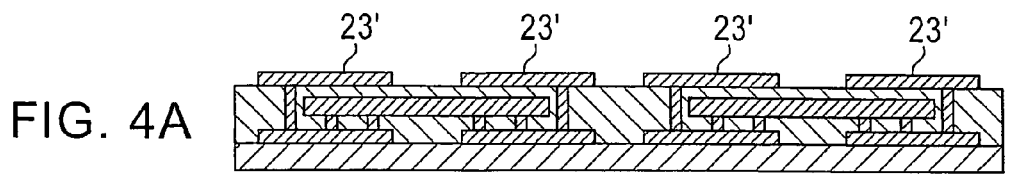

In the same way as step S2, the interconnection patterns 23' (that is, additional interconnection patterns) are formed on the insulation layer 26 (step S9). The cross-sectional view after forming the interconnection pattern 23' is shown in FIG. 4A. The interconnection pattern 23 and the interconnection pattern 23' may be different patterns, or the same patterns.

Figure 4B:
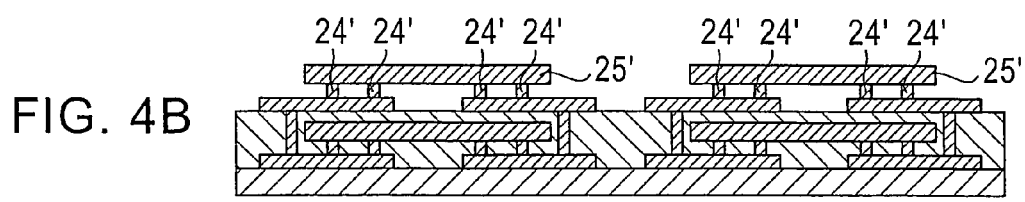

The semiconductor chips 25' are mounted on the interconnection patterns 23' via the bumps 24' by a flip chip connection, just like step S3 (step S10). As FIG. 4B shows, the semiconductor chips 25' may be stacked on the semiconductor chips 25 in the cross-sectional view, and overlapped in the plan view. On a semiconductor chip 25 judged as defective in the judgment in step S5, a next semiconductor chip 25' is not mounted. This means that a semiconductor device, after the cutting process, can include a defective chip 25 which does not function properly. However, no new semiconductor chip 25' is stacked on the defective chip 25 so that the defective semiconductor device 20 has only a single defective semiconductor chip 25, and loss of non-defective semiconductor chips 25' can be prevented. The semiconductor chip 25 and the semiconductor chip 25' may be different type semiconductor chips, or be the same type semiconductor chips.

Figure 4C:
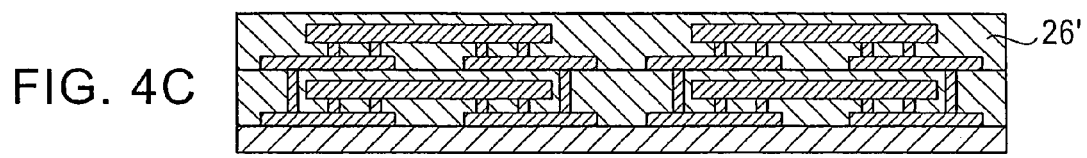
Figure 4D:
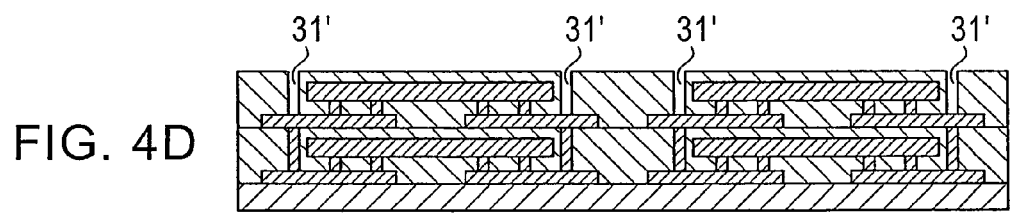
Figure 4E:
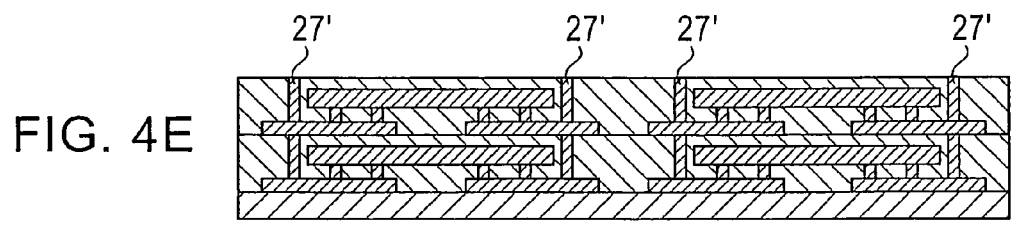
Figure 4F:
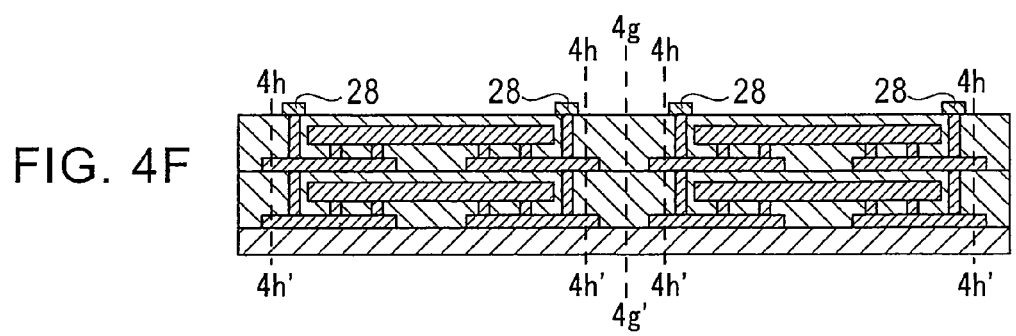

The characteristics of the semiconductor chips 25' are measured, just like step S4 (step S11). Then defective/non-defective semiconductor chips 25' are judged, just like step S5 (step S12). The insulation layer 26' is formed, just like step S6 (step S13). Via holes 31' are formed just like step S7 (step S14). Vias 27' are formed, just like step S8 (step S15). External connection terminals 27 are formed in the same manner as step S9 (step S16). The cross-sectional view after forming the insulation layer 26' is shown in FIG. 4C. The cross-sectional view after forming the via holes 31' is shown in FIG. 4D. The cross-sectional view after forming the vias 27' is shown in FIG. 4E. The cross-sectional view after forming the external connection terminals 28 is shown in FIG. 4F. The external connection terminals 28 may have the same shape as the interconnection patterns 23 and 23'.

After the interconnection patterns 23' are formed in step S9, the step S10 to step S16 are executed (that is, step S3 to step S9 are repeated), whereby the semiconductor device 20 having a layered structure can be formed. Also it is possible to stack three or more chip interconnection layers 22 by forming the interconnection patterns 23' in step S16, and repeating step S3 (S10) to step S9 (S16) only when the semiconductor chips 25 are non-defective.

The semiconductor device wafer is cut (diced) along the broken line 4g-4g' shown in FIG. 4F (that is, a position which is in parallel with the side faces of the semiconductor chips 25 and 25', and does not cut the interconnection patterns 23 and 23') using a blade (not illustrated), and the semiconductor device wafer at a wafer level (that is, a plurality of the semiconductor devices 20 are arrayed horizontally) is separated into chips 20 (step S17). If smaller semiconductor devices 20 are needed, the semiconductor device wafer may be cut along the broken line 4h-4h' shown in FIG. 4F (that is, a position where the semiconductor chips 25 and 25' and the vias 31 and 31' are not separated). Specifically, the position of the broken line 4h-4h' may be between the vias 31 and 31' and the other end of the interconnection patterns 23 and 23', where the semiconductor devices 25 and 25' are not mounted.

Now an example of an interconnection pattern to be formed on the support substrate 21 and the insulation layer 26 will be described with reference to FIG. 5.

On the support substrate 21, an area where the semiconductor chip 25 is mounted (hereafter called the "mounting area") 50 enclosed by the dash and dotted line 5a is predetermined. This mounting area 50 differs depending on the size of the semiconductor chip 25. On the support substrate 21, interconnections 23a which extend from the inside of the mounting area 50 to the outside of the mounting area 50 are formed. The measurement pads 23b are provided at the outside ends of the interconnections 23a. The interconnection 23a and the measurement pad 23b are collectively called an "interconnection pattern 23." Since the top faces of the measurement pads 23b are not covered by the semiconductor chip 25 even after the semiconductor chip 25 is mounted in the mounting area 50, the characteristics of the semiconductor chip 25 can be inspected by contacting a probe to the measurement pad(s) 23b. The measurement pads 23b may be solder-coated. By this solder coating, an electric contact can be performed with certainty when a probe is contacted, which improves the inspection accuracy and yield.

Figure 5:
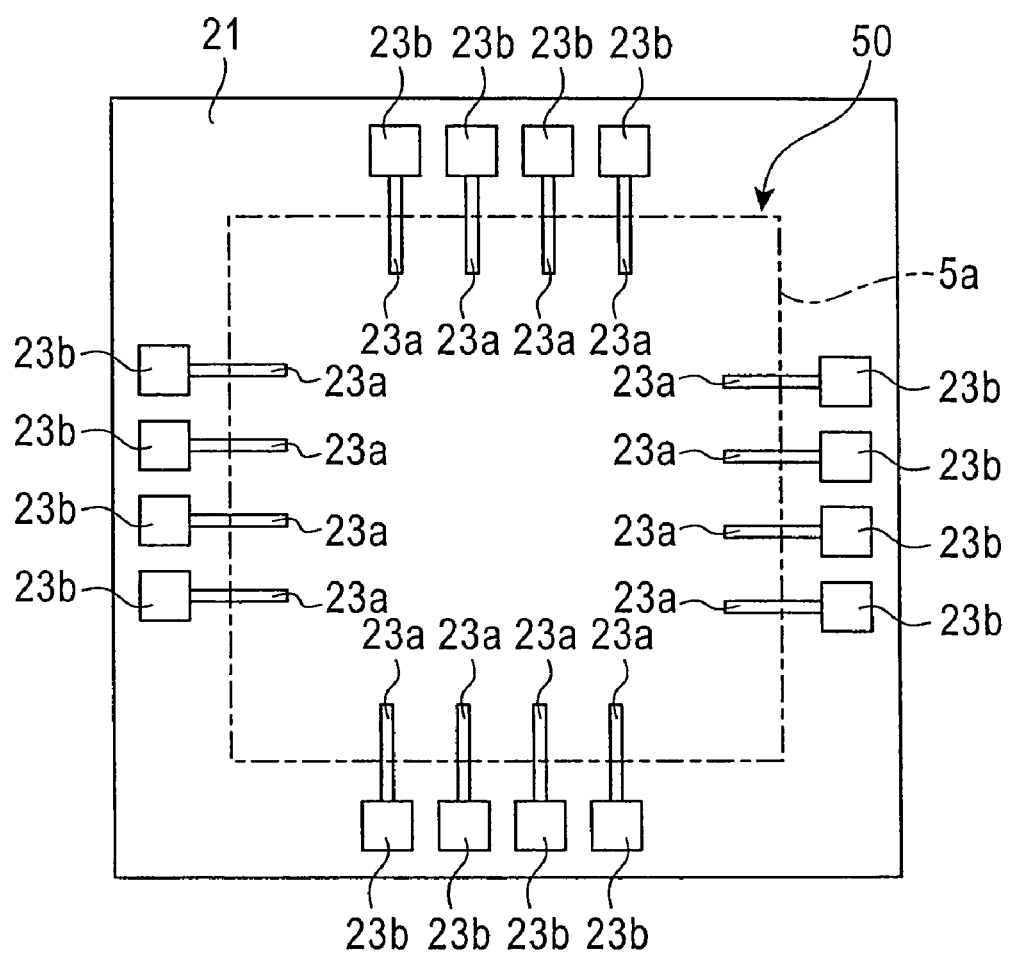
FIG. 5 is a plan view of an interconnection pattern in the semiconductor device according to Embodiment 1 of the present invention.

The interconnection patterns 23 are not limited to those illustrated in FIG. 5. For example, a plurality of rows of measurement pads 23b may be formed around the mounting area 50 according to the positions of the pads of the semiconductor chip 25 and the probe positions. Also, the lengths of the interconnections 23a may be changed individually. The interconnection patterns 23' formed on the insulation layer 26 are basically the same as those on the support substrate 21 so that description thereof is omitted.

As described above, according to the fabrication method for semiconductor devices of the first embodiment, characteristics of the semiconductor chips are inspected via the interconnection patterns after mounting the semiconductor chips. Thus, yield of the semiconductor devices can be improved, and loss of non-defective chips can be decreased or prevented.

Embodiment 2

Figure 6:
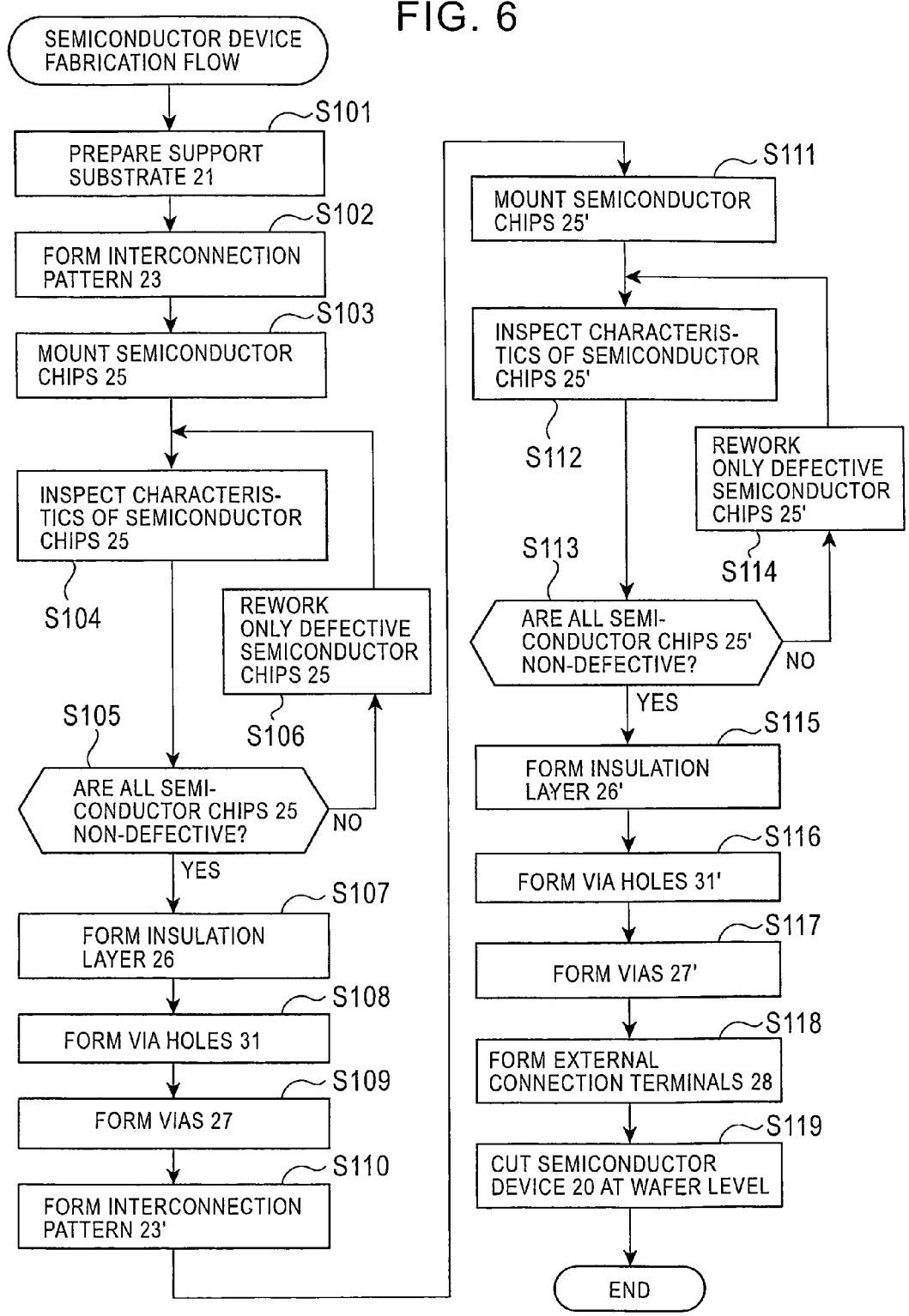
FIG. 6 is a flow chart depicting a semiconductor device fabrication method according to Embodiment 2 of the present invention.
Figure 7:
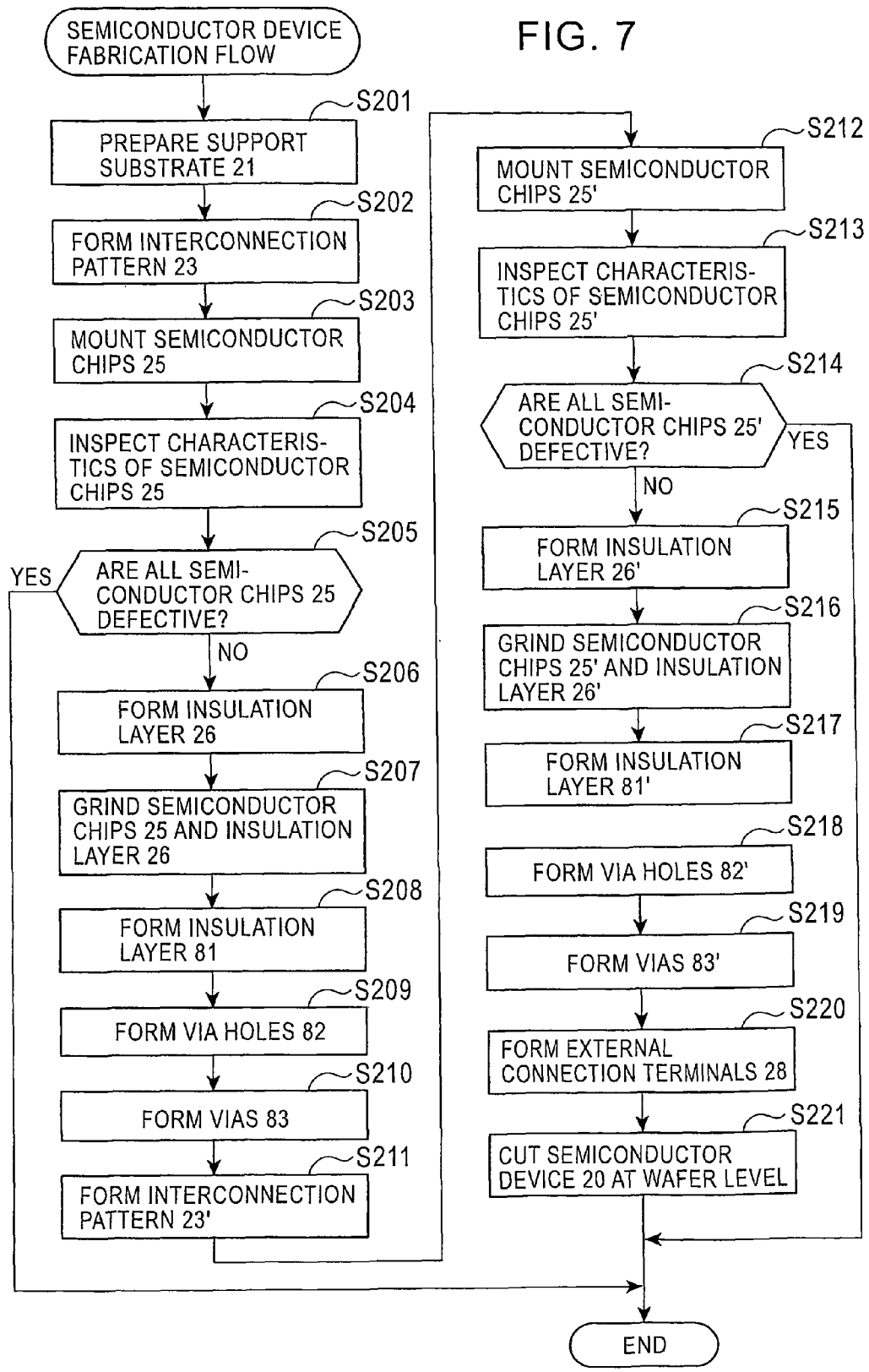
FIG. 7 is a flow chart depicting a semiconductor device fabrication method according to Embodiment 3 of the present invention.

In the semiconductor device fabrication method of Embodiment 1, reworking of a defective semiconductor chip is not described. In the second embodiment, a defective semiconductor is reworked after characteristics of the semiconductor chip are inspected. This modification to the fabrication method of Embodiment 1 will be described with reference to FIG. 6.

The processing from step S101 to step S105 in the second embodiment is the same as the processing from step S1 to step S5 in the fabrication method of Embodiment 1, so that description thereof is omitted.

If it is determined that the semiconductor chips 25 are non-defective in step S105, the insulation layer 26 is formed in the same way as step S6 in Embodiment 1 (step S107). If it is determined that any of the semiconductor chips 25 is defective, only such defective semiconductor chip(s) 25 is (are) reworked (step S106). After reworking the semiconductor chip 25, characteristics of the semiconductor chip 25 are inspected again. In other words, step S104 is performed again. Therefore processing does not advance to the next step unless the semiconductor chips 25 are non-defective. The reinspection of the semiconductor chips 25 after reworking may be performed only on the reworked semiconductor chip 25, or may be performed on all the semiconductor chips 25 (including chips other than the reworked semiconductor chip 25).

The processing from step S107 to step S112 in the second embodiment is the same as the processing from step S6 to step S11 in the fabrication method of Embodiment 1, so that description thereof is omitted.

If it is determined in step S113 that the semiconductor chips 25' are non-defective, the insulation layer 26' is formed in the same way as step S13 of Embodiment 1 (step S115). If it is determined that a semiconductor chip 25' is defective, only the defective semiconductor chip 25' is reworked (step S114). The reinspection step after step S114 (in other words, performing step S112 again) is the same as the case of moving from step S106 to step S104, so that description thereof is omitted. The processing from step S115 to step S119 is also the same as the processing from step S13 to step S17 in the fabrication method of Embodiment 1, so that description thereof is omitted.

As described above, according to the semiconductor device fabrication method of the second embodiment, the defective semiconductor chip is reworked, and processing does not advance to the next step unless the semiconductor chips to be mounted are non-defective. Thus, yield of the semiconductor devices can be improved, and loss of non-defective chips can be decreased or prevented.

Embodiment 3

In the fabrication method for semiconductor devices of Embodiment 1, a grinding step is not described. In the third embodiment, the semiconductor chips and the insulation layer are ground after the insulation layer is formed. This modification to Embodiment 1 will be described with reference to FIG. 7, FIGS. 8A to 8H and FIGS. 9A to 9G.

The step S201 to step S206 in the third embodiment are the same as the steps S1 to S6 in the fabrication method of Embodiment 1, so that description thereof is omitted. FIGS. 8A to 8D are the same as FIGS. 3A to 3D.

Figure 8A:
FIG. 8A to FIG. 8H and FIG. 9A to FIG. 9G are a series of cross-sectional views of the semiconductor device depicting the fabrication steps according to Embodiment 3 of the present invention.
Figure 8B:
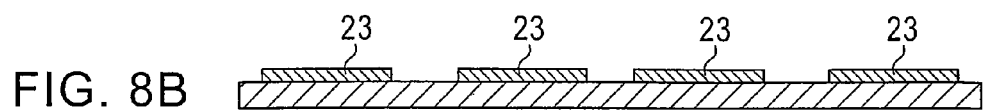
Figure 8C:
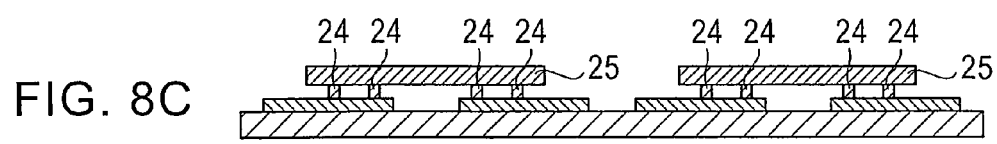
Figure 8D:
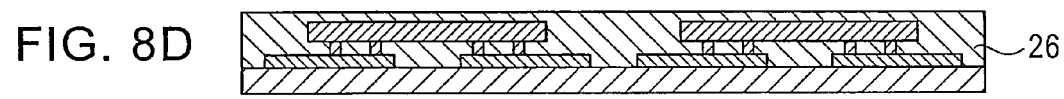
Figure 8E:
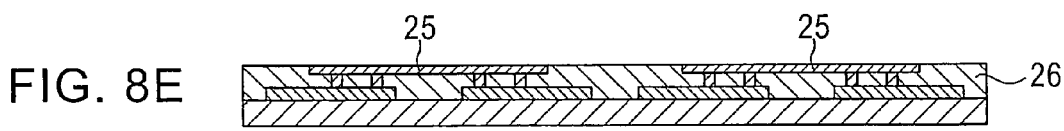

After the insulation layer 26 is formed, the semiconductor chips 25 and the insulation layer 26 are mechanically ground to be a predetermined thickness (step S207). For example, the mechanical grinding uses a grinding stone. Alternatively, high speed grinding method using a diamond tool may be employed. The cross-sectional view after grinding is depicted in FIG. 8E. As FIG. 8E shows, the grinding plane is in parallel with the support substrate 21.

Figure 8F:
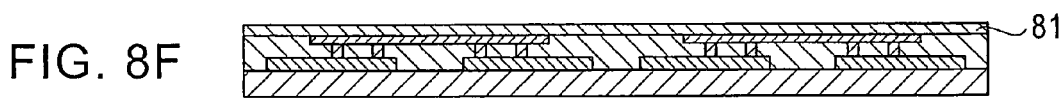

The insulation layer 81 is formed on the semiconductor chips 25 and the insulation layer 26 (step S208). The cross-sectional view after forming the insulation layer 81 is shown in FIG. 8F. The formation of the insulation layer is the same as step S6 of Embodiment 1, so that description thereof is omitted.

Figure 8G:
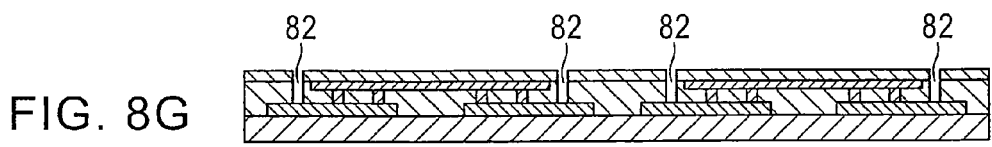

The via holes 82, which penetrate through the insulation layer 26 and the insulation layer 81 and reach the interconnection patterns 23, are formed (step S209). The cross-sectional view after forming the via holes 82 is shown in FIG. 8G. The formation of the via holes is the same as step S7 of Embodiment 1, so that description thereof is omitted.

Figure 8H:
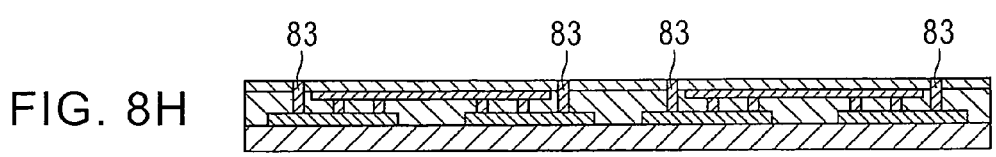

The vias 83, for electrically connecting with the interconnection patterns 23, are formed in the via holes 82 (step S210). The cross-sectional view after forming the vias 83 is shown in FIG. 8H. The formation of the vias is the same as step S8 of Embodiment 1, so that description thereof is omitted.

Figure 9A:
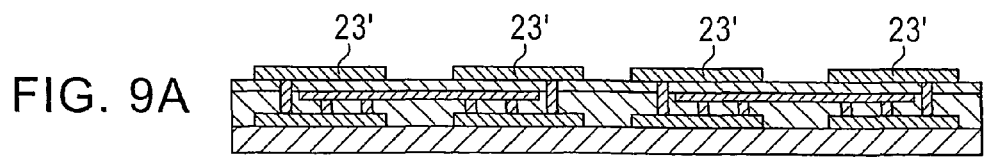
Figure 9B:
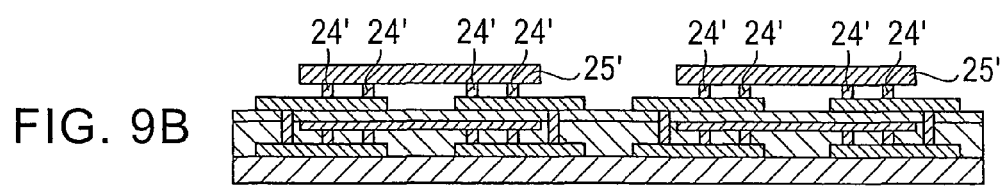
Figure 9C:
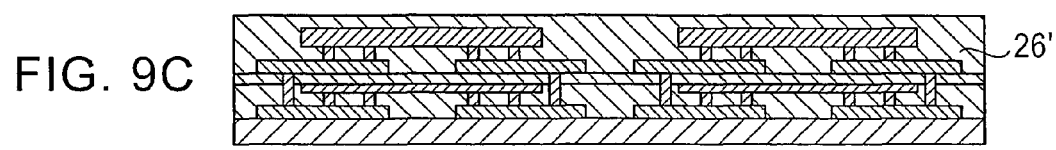
Figure 9D:
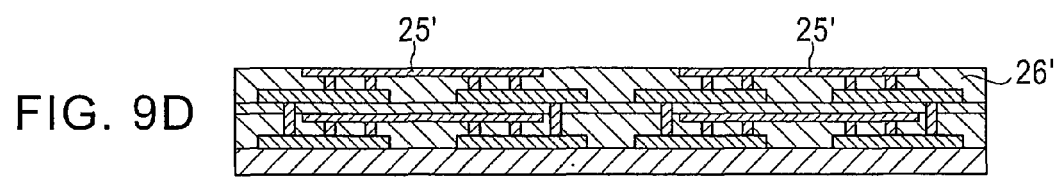
Figure 9E:
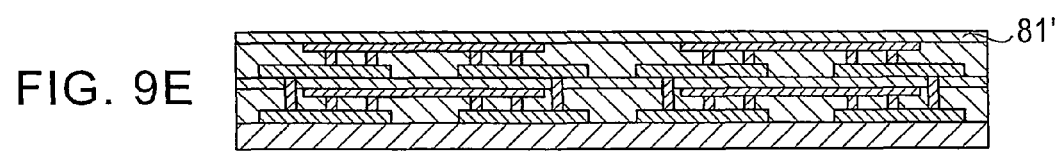
Figure 9F:
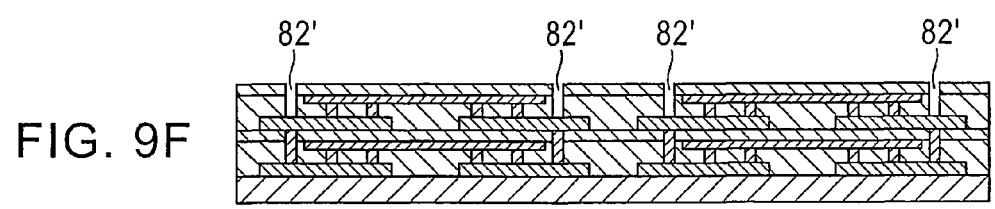
Figure 9G:
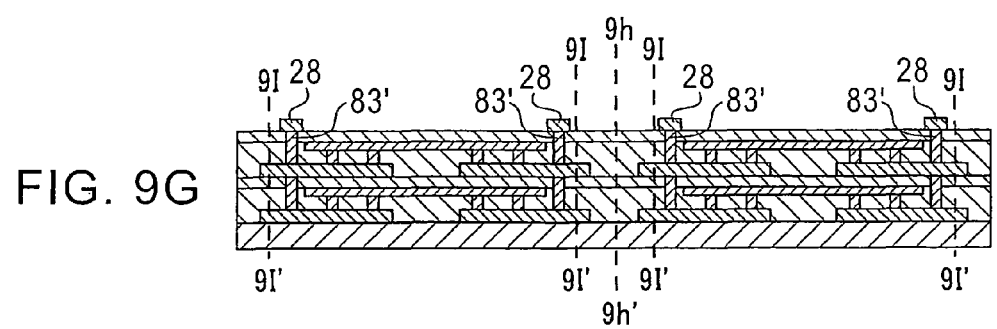

The step S211 to step S215 are the same as the steps S9 to step S13 in the fabrication method of Embodiment 1, so that description thereof is omitted. After forming the insulation layer 26', step S216 to step S219 that are substantially the same as step S207 to step S210 are performed. Thus, the grinding of the semiconductor chip 25' and the insulation layer 26' is carried out (step S216; FIG. 9D), the formation of the insulation layer 81' is carried out (step S217; FIG. 9E), the formation of the via holes 82' is carried out (step S218; FIG. 9F), and the formation of the vias 83' is carried out (steps S219; FIG. 9G).

Then, the external connection terminals 28 are formed (step S220). The formation of the external connection terminals is the same as step S16 of Embodiment 1, so that description thereof is omitted. Then just like step S17 of Embodiment 1, the semiconductor devices 20 at a wafer level (or the semiconductor device wafer) is cut along the broken line 9g-9g' or the broken line 9I-9I' in FIG. 9G (step S221).

As described above, the semiconductor device fabrication method of the third embodiment grinds the mounted semiconductor chips and the insulation layer so that thinner semiconductor devices can be fabricated.

Embodiment 4

The fourth embodiment is directed to a structural modification to the first embodiment. In the semiconductor device, the semiconductor chips may be fixed on the support substrate, and the interconnection patterns may be formed above the semiconductor chips. An example of the structure of this semiconductor device will be described with reference to FIG. 10. The semiconductor device to be described in the fourth embodiment is different from the semiconductor device of Embodiment 1 only in structure, and each element and each material thereof are the same. Therefore, detailed description on such content is omitted.

Figure 10:
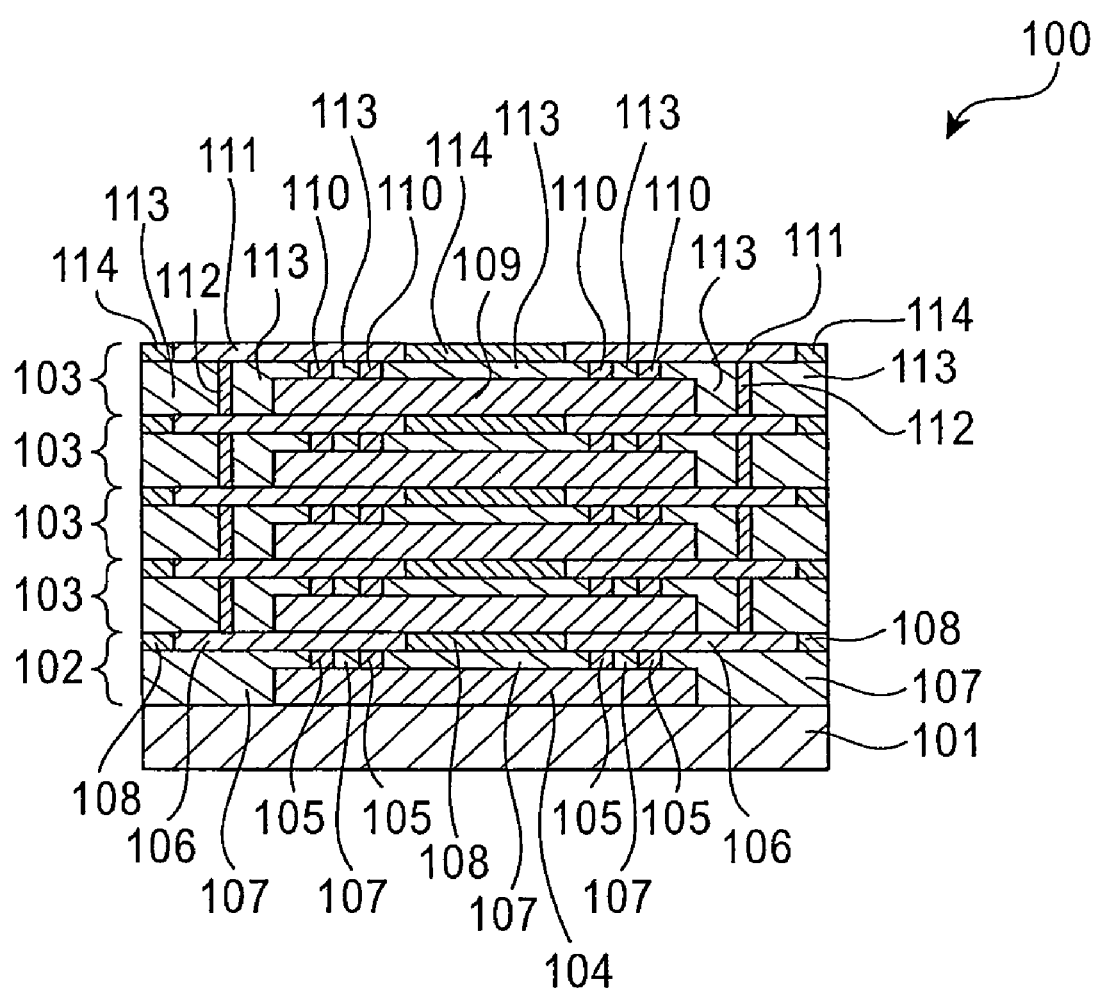
FIG. 10 is a cross-sectional view of a semiconductor device fabricated according to Embodiment 4 of the present invention.
Figure 11:
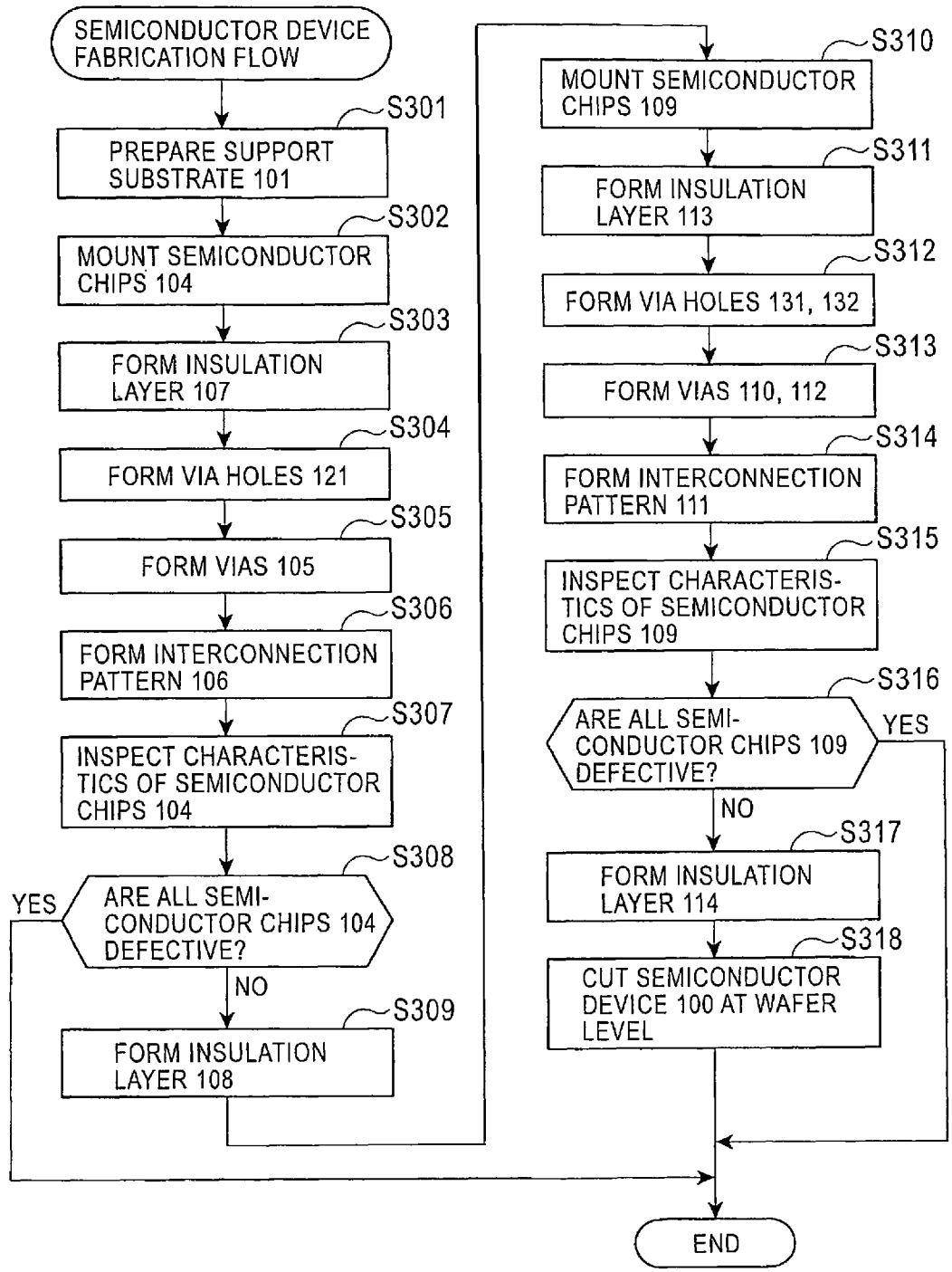
FIG. 11 is a flow chart depicting a semiconductor device fabrication method according to Embodiment 4 of the present invention.

As FIG. 10 shows, the semiconductor device 100 of the fourth embodiment includes a basic chip interconnection layer 102 on the support substrate 101, and a plurality of layered chip interconnection layers 103 stacked on the basic chip interconnection layer 102. It should be noted that the number of the chip interconnection layers 103 is not limited to the number shown in FIG. 10, but can be changed according to the characteristics of the semiconductor device 100.

The basic chip interconnection layer 102 has a semiconductor chip 104 which is fixed on the support substrate 101 so that the pad comes to the top face. The basic chip interconnection layer 102 also has an interconnection patterns 106 which are electrically connected with the semiconductor chip 104 via vias 105. The basic chip interconnection layer 102 also has an insulation layer 107 formed on the support substrate as to cover the semiconductor chip 104 and the vias 105. The basic chip interconnection layer 102 also has an insulation layer 108 having the same thickness as the interconnection pattern 106 formed on the insulation layer 107.

A semiconductor chip 109 has one or more pads. Each of the layered chip interconnection layers 103 has a semiconductor chip 109 which is fixed on the basic chip interconnection layer 102 or the underlying chip interconnection layer 103 which is a lower layer thereof, so that the pad comes to the top face. The chip interconnection layer 103 also has an interconnection patterns 111 which are electrically connected with the semiconductor chip 109 via vias 110. The chip interconnection layer 103 also has vias 112 for electrically connecting the interconnection pattern 106 to the interconnection pattern 111, or connecting the interconnection patterns 111 to each other. The chip interconnection layer 103 also has an insulation layer 113 formed on the support substrate so as to cover the semiconductor chip 109 and vias 110 and 112, and an insulation layer 114 having the same thickness as the interconnection pattern 111 formed on the insulation layer 113. Therefore the semiconductor chip 104 and the semiconductor chip 109 stacked thereon are electrically connected to each other via the vias 112.

The interconnection patterns 111 of the uppermost chip interconnection layer 103 may have a different shape from the other interconnection patterns 111, so as to be connected easily with the outside. For example, it may be interconnection patterns having external connection pads.

By the above-described configuration, the semiconductor chips 104 and 109 of the basic chip interconnection layer 102 and each layered chip interconnection layer 103 are electrically interconnected via the vias 111, and the semiconductor device 100 can acquire the desired electric signals from the interconnection patterns 111 in the top interconnection layer.

An example of the fabrication method for the above-described semiconductor device will now be described with reference to FIG. 11, FIGS. 12A to 12G and FIGS. 13A to 13F. The number of semiconductor chips and the number of layers are not limited to the values shown in FIG. 12A to FIG. 13F, but may be changed according to the producing quantity and structure of the semiconductor device to be fabricated. In the following description, a plurality of semiconductor chips are placed on a single substrate and a wafer is fabricated. The wafer is cut to individual semiconductor devices at the last step of the fabrication process.

Figure 12A:
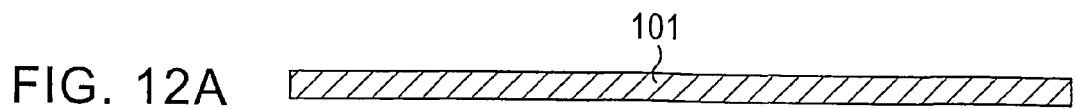
FIG. 12A to FIG. 12G and FIG. 13A to FIG. 13F are a series of cross-sectional views of the semiconductor device depicting the fabrication steps according to Embodiment 4 of the present invention.

First, the support substrate 101 having a predetermined size is prepared (step S301). The cross-sectional view of the support substrate 101 is shown in FIG. 12A.

Figure 12B:
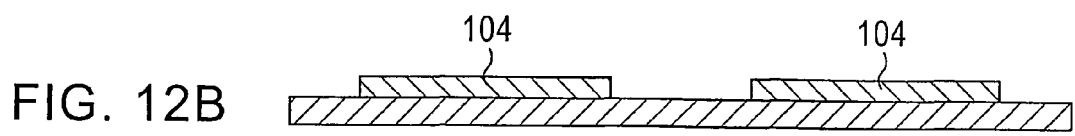

The semiconductor chips 104 are mounted on the support substrate 101 such that the pads come to the top face (step S302). The semiconductor chips 104 may be fixed to the support substrate 101 by adhesive. The cross-sectional view after mounting the semiconductor chips 104 is shown in FIG. 12B.

Figure 12C:
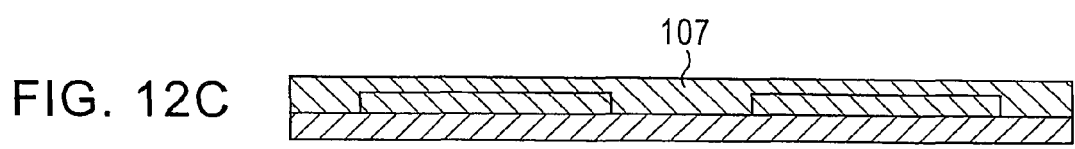

The insulation layer 107 (that is, lower insulation layer) is formed on the support substrate 21 so as to cover the semiconductor chips 104 (step S303). The cross-sectional view after forming the insulation layer 107 is shown in FIG. 12C. The insulation layer formed in this embodiment is the same as the insulation layer formed in Embodiment 1, so that detailed description thereof is omitted.

Figure 12D:
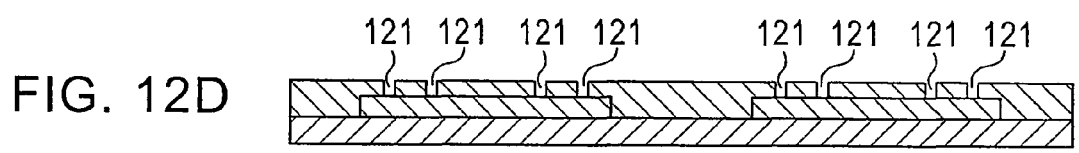

At predetermined positions of the insulation layer 107, the via holes 121, which reach the pads of the semiconductor chips 104, are formed using a laser processing technology (e.g., $CO_2$ laser or eximer laser), or photolithography technology (step S304). The cross-sectional view after forming the via holes 121 is shown in FIG. 12D.

Figure 12E:
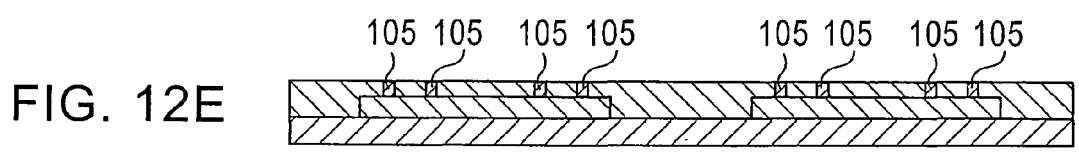

Copper, for example, is grown in the via holes 121, to form the vias 105 for electrically connecting with the pads of the semiconductor chips 104 (step S305). The cross-sectional view after forming the vias 105 is shown in FIG. 12E.

Figure 12F:
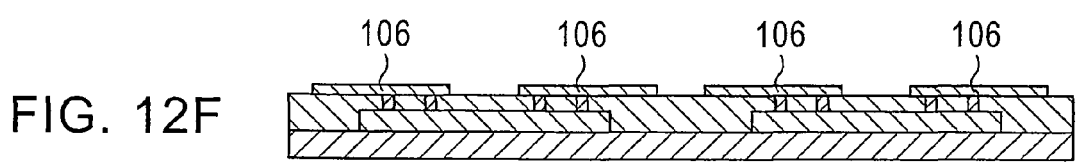

On the insulation layer 107 and the vias 105, a copper metal film is deposited by a sputtering method, for example. Then, a suitable patterning is performed on the metal film by a photolithography technology, and interconnection patterns 106, which are electrically connected with the semiconductor chips 104 via the vias 105, are formed (step S306). The cross-sectional view after forming the interconnection patterns 106 is shown in FIG. 12F. The concrete shapes of the interconnection patterns 106 are the same as Embodiment 1, so that description thereof is omitted. It should be noted that the two inner interconnection patterns 106 in FIG. 12F may be connected to each other so that the neighboring semiconductor chips 104 are electrically connected to each other. Then the characteristics of each semiconductor chip 104 are measured via the interconnection patterns 106 (step S307). The specific measurement method is the same as Embodiment 1. Thus, description thereof is omitted.

The measurement results in step S307 are analyzed and evaluated (step S308). Processing advances to step S309 if any one of semiconductor chips 104 is judged as non-defective. If all the semiconductor chips 104 are judged as defective, fabrication of the semiconductor device 100 ends. The specific judgment method is the same as Embodiment 1, so that description thereof is omitted.

Figure 12G:
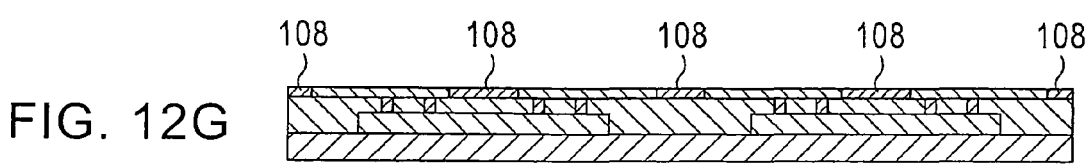

Then the insulation layer 108 (that is, upper insulation layer) having the same thickness as the interconnection patterns 106 is formed (step S309). The cross-sectional view after forming the insulation layer 108 is shown in FIG. 12G.

Figure 13A:
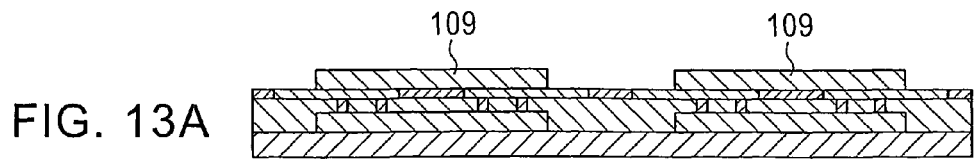

In the same way as step S302, the semiconductor chips 109 are mounted on the interconnection patterns 106 and the insulation layer 108 such that the pads of the semiconductor chips come to the top face (step S310). Because the pads of the semiconductor chips 109 are positioned on the top face, the semiconductor chips 109 are not electrically connected with the interconnection patterns 106. The cross-sectional view after mounting the semiconductor chips 109 is shown in FIG. 13A. The mounting positions of the semiconductor chips 109 with respect to the semiconductor chips 104 are the same as step S10 of Embodiment 1, so that description thereof is omitted.

Figure 13B:
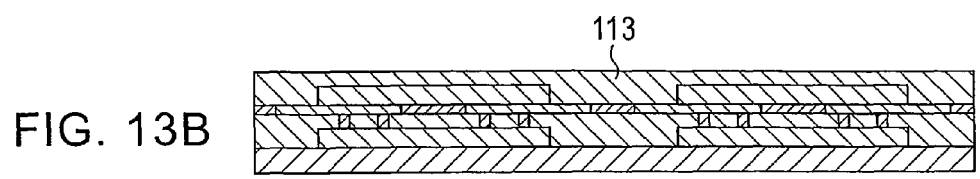

In the same way as step S303, the insulation layer 113 (that is, additional lower insulation layer) is formed on the interconnection pattern 106 and the insulation layer 108 so as to cover the semiconductor chips 109 (step S311). The cross-sectioned view after forming the insulation layer 113 is shown in FIG. 13B.

Figure 13C:
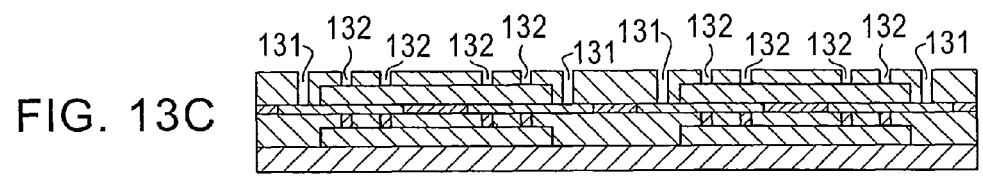

At predetermined positions of the insulation layer 113, the via holes 131 which reach the interconnection patterns 106 and the via holes 132 which reach the pads of the semiconductor chips 109 are formed using a laser processing technology (e.g., $CO_2$ laser or eximer laser) or a photolithography technology (step S312). The cross-sectional view after forming the via holes 131 and 132 is shown in FIG. 13C.

Figure 13D:
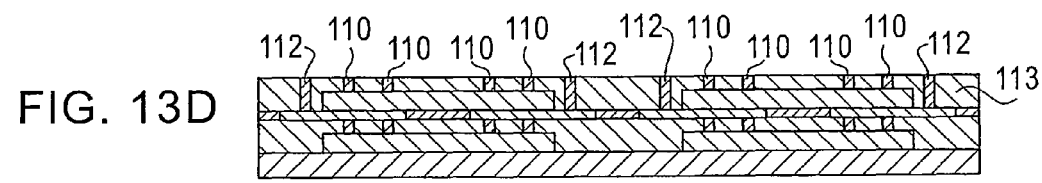

In the same way as step S305, copper, for example, is grown in the via holes 131 and 132, to form the vias 112 for electrically connecting with the interconnection patterns 106 and the vias 110 for electrically connecting with the pads of the semiconductor 109 (step S313). The cross-sectional view after forming the vias 110 and 112 is shown in FIG. 13D.

Figure 13E:
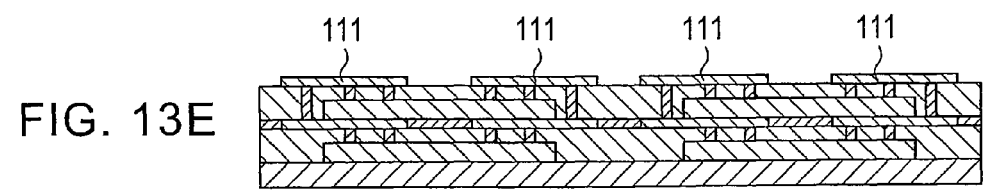

In the same way as step S306, the interconnection patterns 111, which are electrically connected with the semiconductor chips 104 and 109 via the vias 110 and 112, are formed on the insulation layer 113 and the vias 110 and 112 (step S314). The cross-sectional view after forming the interconnection patterns 111 is shown in FIG. 13E.

In the same way as step S307 to step S309, step S315 to step S317 are carried out. Specifically, the characteristics of the semiconductor chips 109 are measured (step S315), the characteristics of the semiconductor chips 109 are evaluated (step S316), and the insulation layer 114 (that is, additional top insulation layer), having the same thickness as the interconnection patterns 111, is formed (step S317). The cross-sectional view after forming the insulation layer 114 is shown in FIG. 13F.

By repeating step S310 to step S314 after forming the insulation layer 114 in step S317, two or more layered chip interconnection layers 103 can be stacked.

Figure 13F:
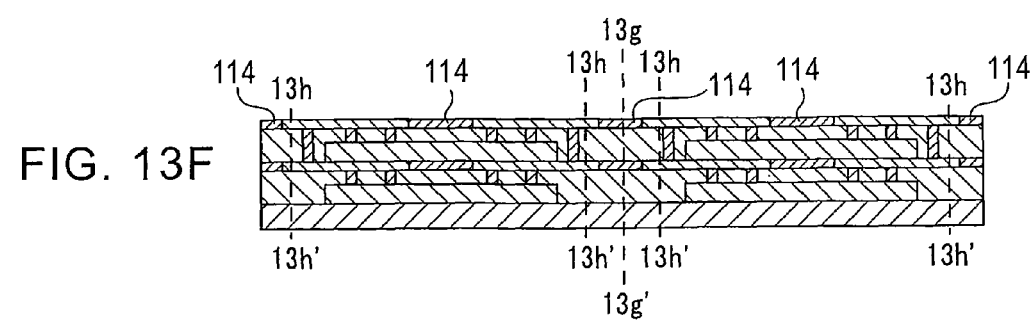

The semiconductor device wafer (i.e., semiconductor devices 100 at a wafer level) is cut along the broken line 13g-13g' shown in FIG. 13F by a blade (not illustrated) to separate the semiconductor device wafer into chips 100 (step S318). If smaller semiconductors 100 are needed, the semiconductor device wafer may be cut along the broken line 13h-13h' shown in FIG. 13F. The cutting positions are the same as step S17 of Embodiment 1. Thus, description thereof is omitted.

According to the semiconductor devices fabrication method of the present embodiment, the characteristics of the semiconductor chips can be inspected via the interconnection patterns after the semiconductor chips are packaged, so that yield of the semiconductor device can be improved, and loss of non-defective semiconductor chips can be decreased or prevented.

This application is based on Japanese Patent. Application No. 2007-153945 filed on Jun. 11, 2007 and the entire disclosure thereof is incorporated herein by reference.

What is claimed is:

1. A fabrication method for a semiconductor device having a layered structure, the fabrication method comprising:
preparing a first layered structure, the first layered structure including a support substrate, a semiconductor chip on the support substrate, a lower insulation layer over the semiconductor chip, a basic conductive element that penetrates through the lower insulation layer and reaches the semiconductor chip, and a basic interconnection pattern on the lower insulation layer such that the basic interconnection pattern is connected with the semiconductor chip via the basic conductive element;
inspecting characteristics of the semiconductor chip via at least a part of the basic interconnection pattern;
forming an upper insulation layer on a remaining part of the lower insulation layer when it is determined that the semiconductor chip possesses predetermined characteristics, the upper insulation layer having the same thickness as the basic interconnection pattern on the lower insulation layer;
forming another layered structure on the upper insulation layer and the basic interconnection pattern, said another layered structure including another semiconductor chip on the upper insulation layer and the basic interconnection pattern, an additional lower insulation layer over said another semiconductor chip and the upper insulation layer, an additional conductive element that penetrates through said additional lower insulation layer and reaches the another semiconductor chip, a connection conductive element that penetrates through said additional lower insulation layer and reaches the basic interconnection pattern, and an additional interconnection pattern that is connected with said another semiconductor chip via said additional conductive element and connected with the basic interconnection pattern via the connection conductive element;
inspecting characteristics of said another semiconductor chip via at least a part of said additional interconnection pattern; and
forming an additional upper insulation layer having the same thickness as said additional interconnection pattern on said additional lower insulation layer when it is determined that said another semiconductor chip possesses predetermined characteristics.

2. The fabrication method for a semiconductor device according to claim 1, wherein said preparing a first layered structure includes:
preparing the support substrate;
mounting the semiconductor chip on the support substrate;
forming the lower insulation layer, that covers the semiconductor chip, on the support substrate;
forming the basic conductive element that penetrates through the lower insulation layer and reaches a connection pad of the semiconductor chip; and
forming the basic interconnection pattern on a part of the lower insulation layer such that the basic interconnection pattern is connected with the semiconductor chip via the basic conductive element.

3. The fabrication method for a semiconductor device according to claim 1, wherein said preparing a second layered structure includes:
mounting said another semiconductor chip on the upper insulation layer and the basic interconnection pattern;
forming said additional lower insulation layer, that covers the another semiconductor chip, on the basic interconnection pattern and the upper insulation layer;
forming said additional conductive element that penetrates through said additional lower insulation layer and reaches the connection pad of said another semiconductor chip;
forming the connection conductive element that penetrates through said additional lower insulation layer and reaches the basic interconnection pattern; and
forming said additional interconnection pattern that is connected with said another semiconductor chip via said additional conductive element and connected with the basic interconnection pattern via the connection conductive element.

4. The fabrication method for a semiconductor device according to claim 2, wherein said preparing a second layered structure includes:
mounting said another semiconductor chip on the upper insulation layer and the basic interconnection pattern;
forming said additional lower insulation layer, that covers the another semiconductor chip, on the basic interconnection pattern and the upper insulation layer;
forming said additional conductive element that penetrates through said additional lower insulation layer and reaches the connection pad of said another semiconductor chip;
forming the connection conductive element that penetrates through said additional lower insulation layer and reaches the basic interconnection pattern;
forming said additional interconnection pattern that is connected with said another semiconductor chip via said additional conductive element and connected with the basic interconnection pattern via the connection conductive element.

5. The fabrication method for a semiconductor device according to claim 3 further comprising repeating said mounting another semiconductor chip, said forming an additional lower insulation layer, said forming an additional conductive element, said forming a connection conductive element, said forming an additional interconnection pattern, said inspecting characteristics of said another semiconductor chip and said forming an additional upper insulation layer after said forming an additional upper insulation layer when said inspecting characteristics of said another semiconductor chip determines that said another semiconductor chip is non-defective.

6. The fabrication method for a semiconductor device according to claim 4 further comprising repeating said mounting another semiconductor chip, said forming an additional lower insulation layer, said forming an additional conductive element, said forming a connection conductive element, said forming an additional interconnection pattern, said inspecting characteristics of said another semiconductor chip and said forming an additional upper insulation layer after said forming an additional upper insulation layer when said inspecting characteristics of said another semiconductor chip determines that said another semiconductor chip is non-defective.

7. The fabrication method for a semiconductor device according to claim 5 further comprising cutting the semiconductor device along a line, which is parallel with a side face of the semiconductor chip and which does not separate the semiconductor chip from the connection conductive element, after said repeating is completed.

8. The fabrication method for a semiconductor device according to claim 6 further comprising cutting the semiconductor device along a line, which is parallel with a side face of the semiconductor chip and which does not separate the semiconductor chip from the connection conductive element, after said repeating is completed.

9. The fabrication method for a semiconductor device according to claim 3, wherein said mounting a semiconductor chip mounts a plurality of semiconductor chips on the basic interconnection patterns, and said mounting another semiconductor chip is performed only on those semiconductor chips which are determined to be non-defective in said inspecting characteristics of the semiconductor chip.

10. The fabrication method for a semiconductor device according to claim 4, wherein said mounting a semiconductor chip mounts a plurality of semiconductor chips on the basic interconnection patterns, and said mounting another semiconductor chip is performed only on those semiconductor chips which are determined to be non-defective in said inspecting characteristics of the semiconductor chip and said inspecting characteristics of said another semiconductor chip.

11. The fabrication method for a semiconductor device according to claim 9 further comprising electrically connecting two semiconductor chips among said plurality of semiconductor chips on the basic interconnection pattern.

12. The fabrication method for a semiconductor device according to claim 10 further comprising electrically connecting two semiconductor chips among said plurality of semiconductor chips on the basic interconnection pattern.

13. The fabrication method for a semiconductor device according to claim 2, wherein said mounting a semiconductor chip on the support substrate is carried out with adhesive.

14. The fabrication method for a semiconductor device according to claim 1, wherein the basic interconnection pattern expands more than an area occupied by the semiconductor chip.

15. The fabrication method for a semiconductor device according to claim 1, wherein said additional interconnection pattern expands more than an area occupied by said another semiconductor chip.

* * * * *